(12) United States Patent
Wynen et al.

(10) Patent No.: US 6,578,154 B1
(45) Date of Patent: Jun. 10, 2003

(54) CLOCK DUTY CYCLE CORRECTION CIRCUIT WHICH CORRECTS AN INPUT CLOCK BY DIRECTLY COMPARING THE INPUT CLOCK WITH A REFERENCE CLOCK GENERATED BY THE OUTPUT CLOCK

(75) Inventors: John Wynen, Conestogo (CA); Richard Madter, Puslinch (CA); Andrew Fergusson, St. Clements (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 09/480,811

(22) Filed: Jan. 10, 2000

(51) Int. Cl.[7] ............................. G06F 1/04; H03K 3/017
(52) U.S. Cl. ...................... 713/500; 327/101; 327/102; 327/175
(58) Field of Search ................................ 327/173–175, 327/35, 101, 102; 375/238; 713/500

(56) References Cited

U.S. PATENT DOCUMENTS

| | | | |
|---|---|---|---|
| 5,210,755 A | | 5/1993 | Nagler et al. |
| 5,485,126 A | * | 1/1996 | Gersbach et al. ............ 327/175 |
| 5,508,664 A | | 4/1996 | Rizzo |
| 5,572,158 A | * | 11/1996 | Lee et al. .................... 327/170 |
| 6,121,805 A | * | 9/2000 | Thamsirianunt et al. ..... 327/131 |

* cited by examiner

Primary Examiner—Thomas Lee
Assistant Examiner—Mark Connolly
(74) Attorney, Agent, or Firm—Jones Day; Krishna K. Pathiyal, Esq.; Charles B. Meyer, Esq.

(57) ABSTRACT

A clock signal duty cycle control circuit is provided that receives an incoming signal from a clock signal input source and generates an improved output clock signal having an accurately controlled duty cycle. The circuit controls the duty cycle of the output clock signal by comparing the incoming signal to a reference value in a comparator. The reference value is derived from a reference charge stored on a capacitor. The reference charge is built up in the capacitor using the currents from a current source and a current sink, which are controlled using translated output signals from the comparator.

17 Claims, 4 Drawing Sheets

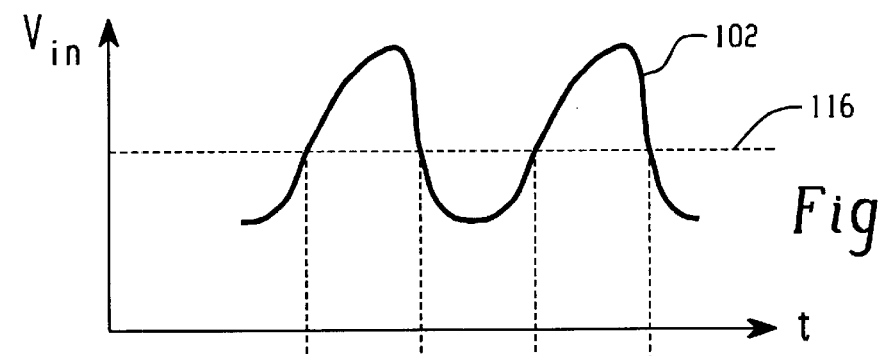
Fig. 6A
Fig. 6B
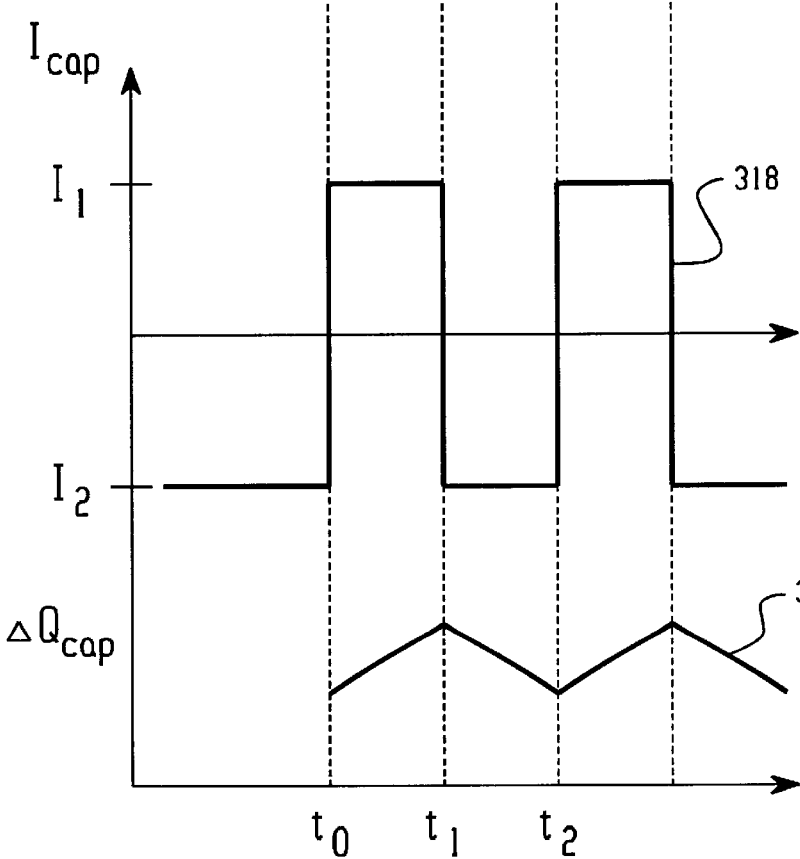
Fig. 6C
Fig. 6D

CLOCK DUTY CYCLE CORRECTION CIRCUIT WHICH CORRECTS AN INPUT CLOCK BY DIRECTLY COMPARING THE INPUT CLOCK WITH A REFERENCE CLOCK GENERATED BY THE OUTPUT CLOCK

BACKGROUND OF THE INVENTION

1. Field of the Invention

The invention relates to the field of precision-controlled duty cycle clock circuits for use with electronic devices. More specifically, the invention provides a circuit having an adaptive adjustment to improve the controllability of the duty cycle of an output clock signal in response to the changing characteristics of an input clock signal. The invention finds application in a variety of electronic devices, including wireless communications devices.

2. Description of the Related Art

Many high performance clocked digital circuits require a clock signal with a precisely controlled duty cycle. These types of circuits may use both the high and low phases of the clock signal to perform computations. If, for example, a circuit has the same timing requirements for both the high and low phase of the clock signal, then a clock signal with an accurate 50/50 duty cycle yields the maximum amount of time in each phase of the clock signal for any given frequency. Clock sources with less accurate control over their duty cycle would have to operate at a lower frequency to meet the timing requirements of such a circuit. Hence, clock circuits providing accurate duty cycle control allow either a higher clock rate or a lower core voltage, while still maintaining adequate timing margin for circuits operating from both phases of the clock signal.

SUMMARY OF THE INVENTION

A clock signal duty cycle control circuit is provided that receives an incoming signal from a clock signal input source and generates an improved output clock signal having an accurately controlled duty cycle. The circuit controls the duty cycle of the output clock signal by comparing the incoming signal to a reference value with a comparator. The reference value is derived from a reference charge stored on a capacitor. The reference charge is built up in the capacitor using the currents from a current source and a current sink, which are controlled using translated output signals from the comparator.

The duty cycle may be controlled by a reference value generated by building up of charge on a capacitor with a reference current. The charge, which is based on the reference current produced by combining currents flowing from a current sink and current source, produces a voltage across the capacitor. The current source and sink include devices that are programmed during a precharge mode of operation. During programming, the devices memorize a predetermined solution such that during a normal mode of operation the source current is identical to the sink current.

The invention is described in more detail below in terms of a preferred embodiment. As will be appreciated, the invention is capable of other and different embodiments, and its several details are capable of modifications in various respects, all without departing from the invention. Accordingly, the drawings and description of the preferred embodiments are to be regarded as illustrative in nature and not restrictive.

BRIEF DESCRIPTION OF THE DRAWINGS

The present invention will be apparent to those skilled in the art upon reading the following description in view of the accompanying drawings, wherein:

FIG. 6A illustrates a waveform representing a voltage input to the clock signal duty cycle controller shown in FIG. 4;

FIG. 6B illustrates a waveform representing a voltage output from the clock signal duty cycle controller shown in FIG. 4;

FIG. 6C illustrates waveforms that represent the capacitor currents flowing from a current source and a current sink shown in FIGS. 4 and 5;

FIG. 6D illustrates a waveform that represents a change in charge on a reference capacitor in the clock signal duty cycle controller shown in FIGS. 4 and 5;

DETAILED DESCRIPTION OF THE DRAWINGS

Figure 1:
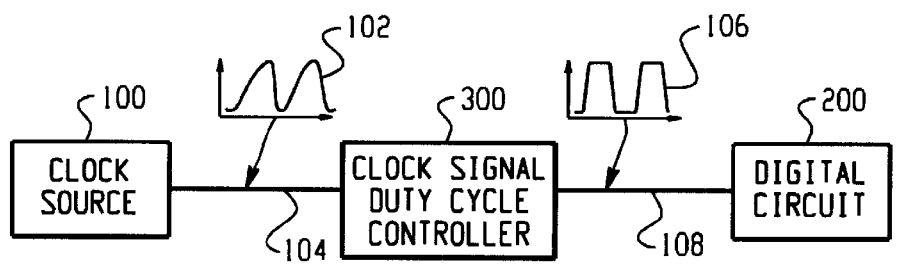
FIG. 1 is a block diagram of a clock signal duty cycle controller coupled between an input clock source and a clocked digital circuit.

Turning now to the drawing figures, FIG. 1 sets forth a block diagram of a clock signal duty cycle controller 300 coupled between an input clock source 100 and a clocked digital circuit 200. As shown in this figure, the input clock source 100 transmits a first clock signal 102, preferably a curvilinear signal, to a clock signal utilizing device 200, preferably a clocked digital circuit, via the clock signal duty cycle controller 300. The first clock signal 102 generated by the clock source 100 and placed on path 104 may be poorly conditioned due to unknown DC offsets, unknown amplitudes or an asymmetrical waveform. In contrast, a second clock signal 106 output from the clock signal duty cycle controller 300, preferably a square-wave clock signal, has an accurately controlled duty cycle and adjusts to changes in characteristics of the clock source 100. The second clock signal 106 is placed on path 108 to be used as the clocking signal for the clocked digital circuit 200.

Figure 2:
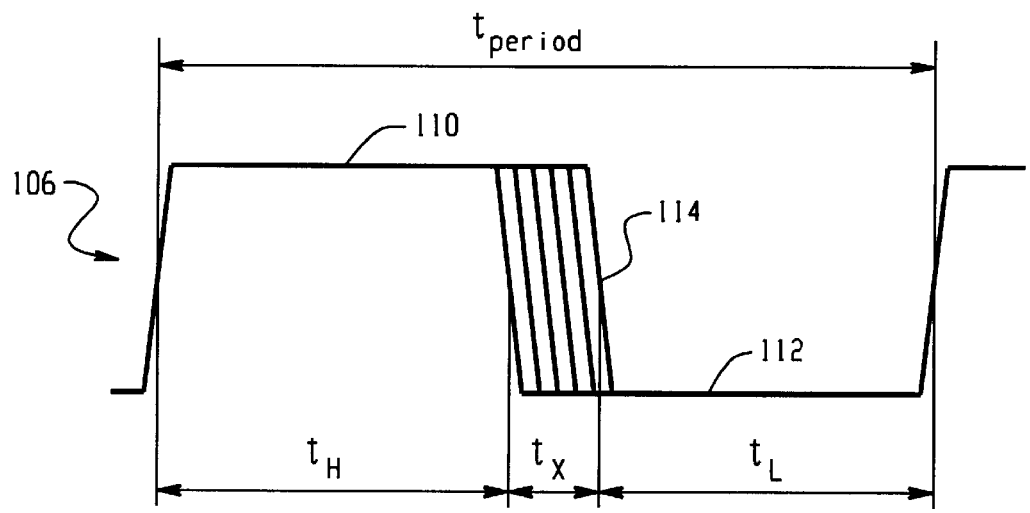
FIG. 2 illustrates a preferred output clock signal generated by the clock signal duty cycle controller of FIG. 1.

FIG. 2 illustrates a preferred output clock signal 106 generated by the clock signal duty cycle controller 300. In one clock period ($t_{period}$), the clock signal 106 includes a high phase signal component (measured in time by $t_H$), a low phase signal component (measured in time by $t_L$), and an uncertainty component (measured in time by $t_X$.) Preferably, the clocked digital circuit 200 performs logic processes during both the high phase ($t_H$) 110 and the low phase ($t_L$) 112 of the clock signal 106. Minimizing the uncertainty phase ($t_X$) 114 permits optimization of the duty cycle ($t_H/t_L$) of the clock signal 106.

By maximizing $t_H$ and $t_L$, the digital circuit 200 can operate at higher clock speeds, it can operate at a lower supply voltage, it can operate at extreme temperatures, or some combination of these parameters. The clock speed, supply voltage, and temperature determine the propagation delay of the digital circuit 200.

When designing a clocked logic circuit, a circuit designer must assume the worst case scenario for the propagation delay of the circuit. This assumption is based on the maximum amount of time the clock signal needs to spend in either it's high or low phases, and the minimum amount of time that is guaranteed to be present in the associated portion of the clock signal. Accordingly, to accommodate the propagation delay it is desirable to minimize the uncertainty component ($t_X$) in the clock signal. By doing so, the high and low phases 110, 112 of the clock signal 106 can be used with maximum efficiency.

For example, the clock signal 106 might have a duty cycle ($t_H/t_L$) between 40/60 and 50/50, e.g., 40 ns/60 ns and 50 ns/50 ns. In this case, the high phase of the clock signal ($t_H$) could be anything between 40 ns and 50 ns, which results in 10 ns in the uncertainty phase ($t_X$) 114. This time in the uncertainty phase 114 cannot be relied upon when determining worst case scenarios. Hence, a digital circuit 200 must be designed that propagates logic in 40 ns. If the time in the uncertainty phase 114 is reduced to 1 ns, then the digital circuit 200 can be designed to propagate signals in 49 ns, thus permitting a greater degree of freedom for the circuit designer.

Figure 3:
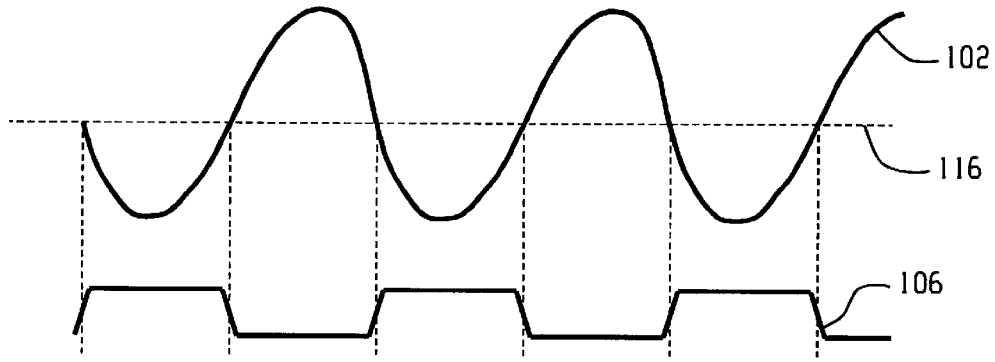
FIG. 3 illustrates several cycles of an input clock signal to the clock signal duty cycle controller an output clock signal from the clock signal duty cycle controller.

FIG. 3 illustrates several cycles of an input clock signal 102 to the clock signal duty cycle controller 300 and an output clock signal 106 from the clock signal duty cycle controller 300. The dotted line 116 represents a predetermined reference value 116, preferably a voltage reference, that is produced by the clock signal duty cycle controller 300. The reference value 116 is produced such that the time the input signal 102 is above the reference 116 and the time the signal 102 is below the reference 116 represents the desired duty cycle of the clock signal 106.

Figure 4:
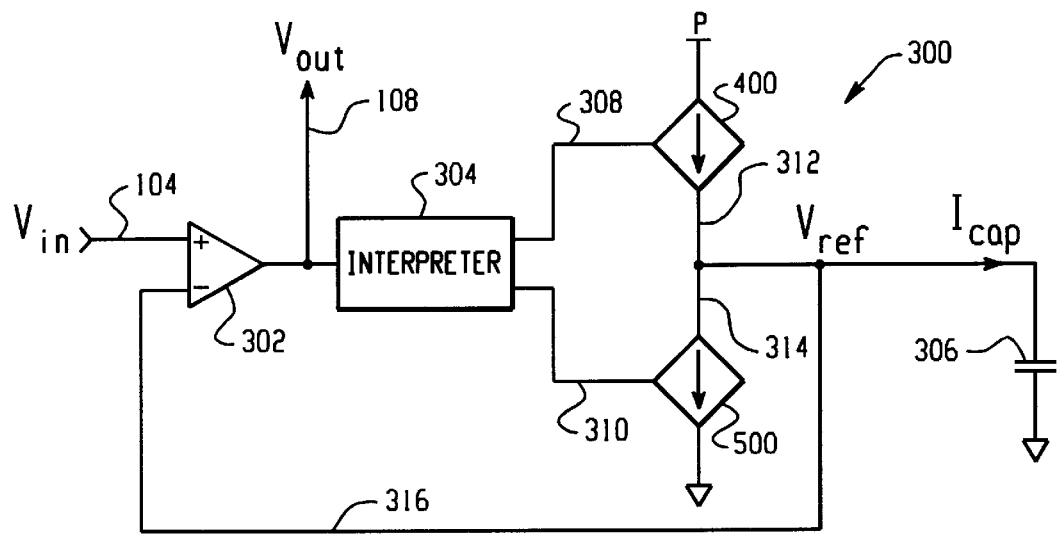
FIG. 4 is a schematic diagram of a preferred clock signal duty cycle controller as shown in FIG. 1.

FIG. 4 is a schematic diagram of a preferred clock signal duty cycle controller 300 as shown in FIG. 1. This circuit 300 includes a comparator 302, a signal processing device 304, preferably an interpreter, a first current device 400, preferably a voltage controlled current source, and a second current device 500, preferably a voltage controlled current sink. The clock signal duty cycle controller 300 further includes a charge integrator 306, preferably a capacitor, that is coupled to the current source 400 and the current sink 500. The capacitor 306 integrates the charge generated by the net current flow from the current source 400 and the current sink 500. Preferably, the current source 400 and current sink 500 include semiconductor devices. Also, the current source is preferably coupled to a power source P.

The voltage input ($V_{in}$) 104 coupled to one input of the comparator 302 is the input clock signal 102. The other input to the comparator 302 is a reference voltage ($V_{ref}$) 316, which is the voltage generated across the integrator 306. The comparator 302 compares the values of $V_{in}$ 104 and $V_{ref}$ 316, and generates a digital output signal ($V_{OUT}$) 108 which is either high or low depending on whether $V_{in}$ is greater than or less than $V_{ref}$. The digital output signal ($V_{OUT}$) 108 is then transformed by the interpreter 304 into an acceptable format for use by the current source 400 and the current sink 500, which are used to generate the reference voltage $V_{ref}$, as described in more detail below.

In the clock signal duty cycle controller 300, transformed voltages from the interpreter 304 are passed to the current source 400 and current sink 500 along paths 308 and 310, respectively. These voltages are input to the current source 400 and current sink 500, respectively, and control the operation of these current devices as described in more detail below. These controlled currents then flow from the current source 400 and the current sink 500 to the capacitor 306 along paths 312 and 314, respectively. A generated reference voltage $V_{ref}$, which is based on the charge $Q_{cap}$ built up on the capacitor 306, is input through path 316 to the negative terminal of the comparator 302 for comparison against the input clock signal ($V_{in}$).

Figure 5:
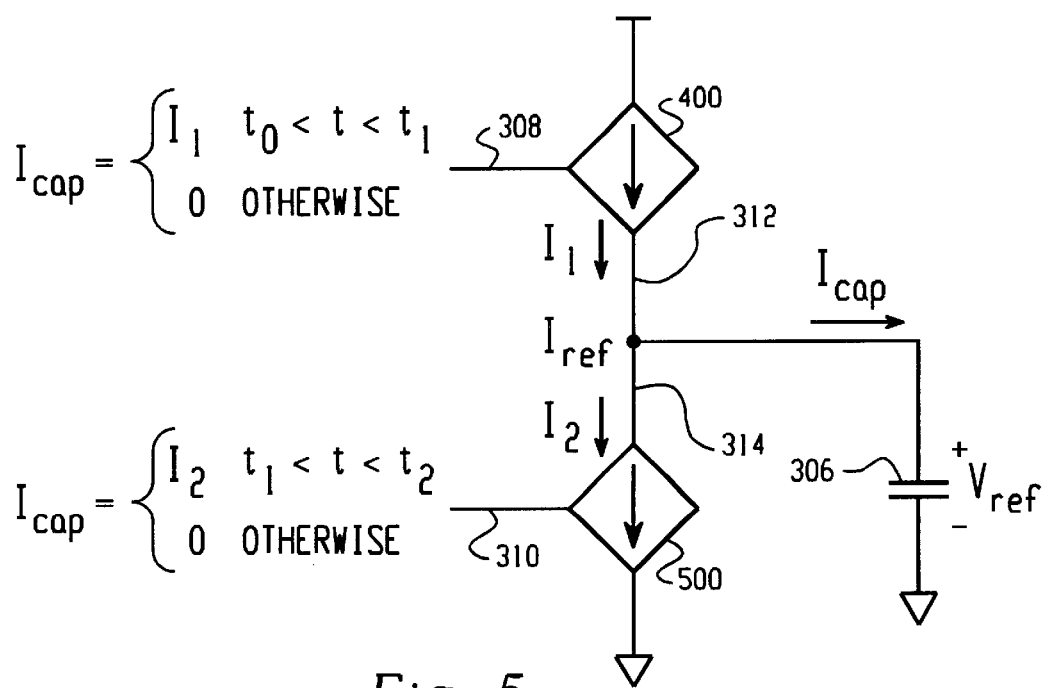
FIG. 5 is a schematic diagram showing the current source and current sink section of the clock signal duty cycle controller of FIG. 4.

FIG. 5 is a schematic diagram showing the current source 400 and current sink 500 sections of the preferred clock signal duty cycle controller 300 of FIG. 4. FIG. 6A illustrates a waveform representing a voltage input ($V_{in}$), FIG. 6B illustrates a waveform representing a voltage output ($V_{OUT}$), FIG. 6C illustrates waveforms that represent the capacitor currents flowing from the current source 400 and current sink 500, and FIG. 6D illustrates a waveform that represents the change in charge on the reference capacitor 306, all in the clock signal duty cycle controller 300 shown in FIGS. 4 and 5.

As seen in FIGS. 5 and 6A–6D, the reference voltage $V_{ref}$ 316 is generated by alternately switching current flow between the current source 400, represented by current $I_1$, and the current sink 500, represented by $I_2$, that flows into the capacitor 306. The current source 400 is controlled by the transformed voltage 308 such that it is only on (and thus conducting current $I_1$) when the input voltage ($V_{in}$) 104 is higher than the reference voltage ($V_{ref}$) 116. Similarly, the current sink 500 is only on when the input voltage ($V_{in}$) 104 is lower than the reference voltage ($V_{ref}$) 116. Thus, with reference to FIGS. 6A–6D, the capacitor current ($I_{cap}$) is equal to $I_1$ during $t_0<t<t_1$ and it is equal to $I_2$ during $t_1<t<t_2$. This capacitor current $I_{cap}$ flows into capacitor 306, which causes a charge $Q_{cap}$ to be stored in the capacitor 306. The generated reference value 116 is the voltage $V_{ref}$ on the capacitor 306, where $Q_{cap}=C\ V_{ref}$ (where C is the capacitance of the capacitor 306). As shown below in equation [2], the capacitor 306 operates as an integrator of the current flow onto the plates of the capacitor 306.

When the clock signal duty cycle controller 300 has reached a stable operating point:

$$\Delta Q_{cap}=0 \text{ and } \Delta V_{ref}=0 \qquad [1]$$

Given that $$\Delta Q_{cap} = \int_{t_0}^{t_2} i_{cap}\,dt = I_1(t_1 - t_0) + (-I_2)(t_2 - t_1) \qquad [2]$$

then:

$$I_1{}^*(t_1-t_0)=I_2{}^*(t_2-t_1) \qquad [3]$$

and:

$$\frac{I_1}{I_2} = \frac{(t_2 - t_1)}{(t_1 - t_0)} \qquad [4]$$

According to these equations, it can be seen that the duty cycle of the output signal ($V_{out}$) 108 can be precisely controlled by adjusting the ratio of the magnitude of the current $I_1$ and $I_2$ from the current source 400 and current sink 500, since these currents produce reference value 116 ($V_{ref}$).

With continuing reference to FIGS. 6A–6D, where 6A–6B are similar to FIG. 3 and are shown for convenience, the values over time for the clock signal voltages 102 and 106 (which are, respectively, coupled to the clock signal duty cycle controller 300 at 104 and 108), the capacitor current 318, and the capacitor charge 320 are shown. As the capacitor charge ($\Delta Q_{cap}$) 320 increases with each successive cycle, the reference voltage ($V_{ref}$) increases as well. Eventually, $V_{ref}$ 306 increases to a point based on the desired duty cycle such that no additional charge is added to the capacitor 306. At that time, the clock signal duty cycle controller 300 reaches equilibrium. The magnitude of the currents $I_1$ and $I_2$ must be accurate in order for their ratio to accurately match the desired duty cycle set out above.

The matching method, as described in detail hereinafter with reference to FIGS. 7–8, "programs" a p-type FET 402, an n-type FET 502, a capacitor 404, and a capacitor 504. In the preferred embodiment, programming refers to storing charge on these capacitors. Programming these devices allows the relative sizes, process variables, and environmental conditions (e.g., temperature) of the circuits in source 400 and sink 500 to be taken into account.

Figure 8:
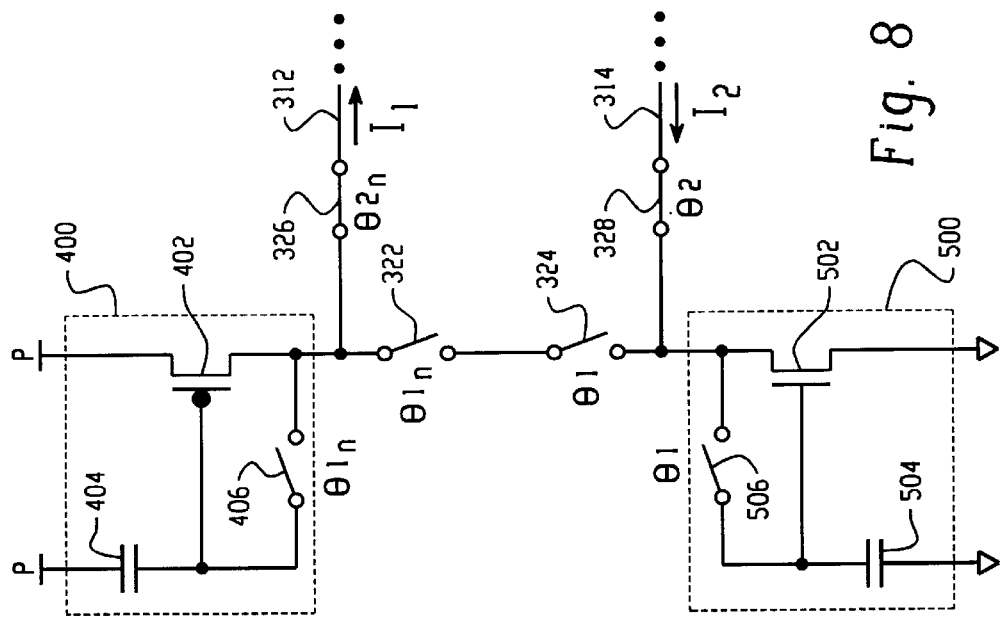
Figure 7:
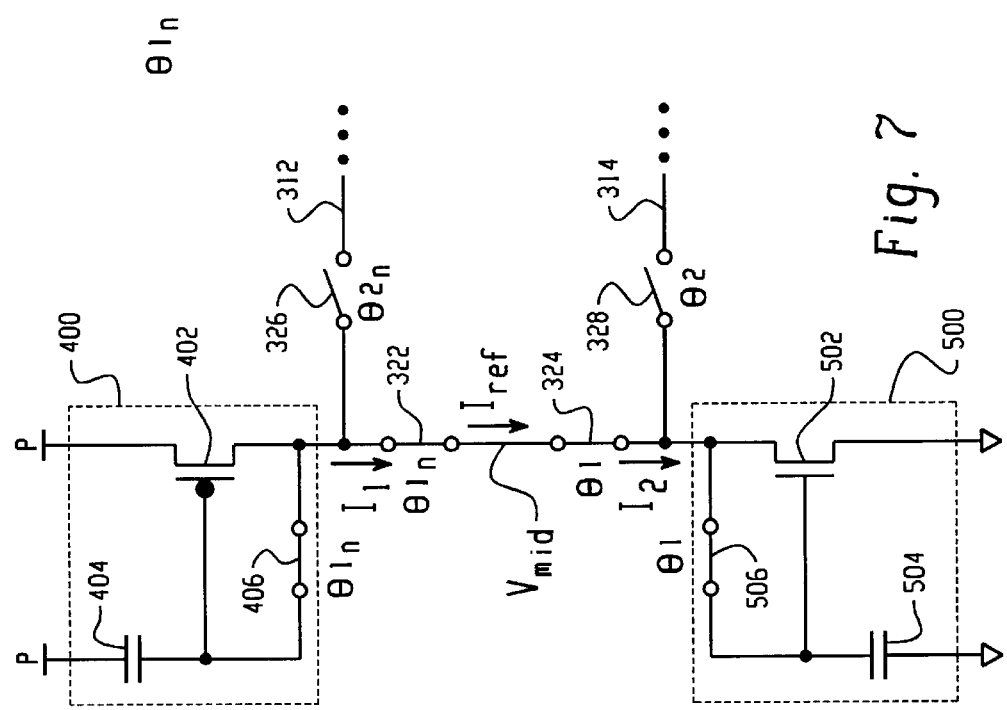
FIG. 7 is a circuit architecture of the current source and the current sink shown in FIG. 4 during a precharge mode of operation; and, FIG. 8 is a circuit architecture of the current source and current sink shown in FIG. 4 during a source/sinking mode of operation.

FIG. 7 is a circuit architecture of the current source 400 and the current sink 500 shown in FIG. 4 during a precharge mode of operation, and FIG. 8 is the same circuit architecture during a source/sinking mode of operation. In the precharge mode of operation shown in FIG. 7, the pFET 402 and the nFET 502 have identical drain-to-source currents ($I_{ds}$), which is accomplished by adding or removing charge from the capacitors 404 and 504 to modify their voltages (and hence the respective gate-to-source voltages ($V_{gs}$) of the pFET 402 and nFET 502). Consequently, current $I_1$ equals current $I_2$, and current $I_2$ equals current $I_{ref}$. In an alternative arrangement, subsequent precharge stages could open switches 322, 324, 406, and 506, and then use the pFET 402, the capacitor 404, the nFET 502, and the capacitor 504 as independent current references to program other nFET and pFET sources, which could be placed in parallel to form an integral current source to sink arrangement.

Programming of the pFET 402 and the nFET 502 during the precharge mode of operation utilizes the physical characteristics of a MOSFET. The main MOSFET characteristic relied upon for programming relates to the gate to source capacitance ($C_{gs}$) of the pFET 402 and nFET 502. Typically, when this capacitance is charged, the accumulated charge generally does not bleed away for some period of time.

Programming is performed in the first phase, as follows. During one phase of the clock signal 106, the current source 400 and sink 500 currents are netted against one another such that they cooperatively adapt their level to make sure that the current running through both the source 400 and sink 500 is identically the same. In this phase of operation, the switches 406, 506 and 322, 324 are closed, and the switches 326 and 328 are open. Thus, in the first phase, the source 400 and sink 500 find a "solution" (i.e., charge value) where the current through both devices is the same. This solution is then "saved" onto the gate to source capacitors, $C_{gs}$, (i.e., memory) of the FETs 402 and 502 and capacitors 404 and 504 by opening switches 406 and 506. When the circuits in the source 400 and sink 500 are reconfigured electrically during the normal mode of operation, i.e., the second phase, the current source 400 and the current sink 500 are utilized separately. The solution programmed in the gate to source capacitors $C_{gs}$ of the FETs 402 and 502 and capacitors 404 and 504 during the precharge mode of operation is utilized to deliver currents $I_1$ and $I_2$ that are very close in magnitude to one another. Also during the normal mode of operation, the solution is used to correct for any variances in actual FET sizes, processes, or temperatures.

Physically, the pFET 402 and the nFET 502 are turned on and conduct currents during the precharge mode of operation. This current does not flow out of the current source 400 and sink 500 since the switches 326 and 328 are open. In this case, the capacitors 404 and 504 take on the current and build up charge. Over time, current flows from the positive voltage supply P through FETs 402 and 502, and then to ground. For example, if the charge on the capacitors 404 and 504 is configured to make the pFET 402 more conductive than the nFET 502, currents flow out of the capacitor 404 and into the capacitor 504 to form a balance. Ideally, the voltage $V_{mid}$ formed at the midpoint of the source 400 and sink 500 is half that of the voltage supply P, and the currents $I_1$ and $I_2$ achieve a steady state value in order to balance the circuit. The capacitors 404 and 504 are subsequently utilized to produce the reference voltage based on their programmed charge.

With reference now to FIG. 8, the previously closed switches 322, 324, 406, and 506 in the precharging phase are now opened in the source/sinking mode of the preferred methodology. Also, previously opened switches 326 and 328 are now closed in accordance with signals 308 and 310 from the interpreter, which allows the pFET 402 and nFET 502 to source/sink current on paths 312 and 314. It is to be appreciated that although the preferred embodiment details a circuit with a given duty cycle ratio, namely 1:1, or 50/50, these principles are extendable to other ratios of integer numbers. Accordingly, multiple versions of the current source 400 and/or sink 500 could be programmed, and then placed in parallel to achieve an M:N ratio duty cycle.

During this mode of operation, a larger gate-to-source voltage ($V_{gs}$) on the nFET 502 causes the FET to conduct larger currents, thus configuring the nFET 502 as a voltage controlled current sink. The higher the voltage across capacitor 504, the more current the nFET 502 is capable of conducting from drain to source. In this configuration, the gate is connected to the drain of the nFET 502 through switch 506, which is the same configuration for pFET 402 and switch 406. For the pFET 402, an opposite control of its current occurs with respect to voltage on capacitor 404, where the drain to source voltage is in an opposite direction compared to nFET 502.

Opening and closing of the switches 322–326 and 406 is controlled by translated signals Φx (x=1, 2, . . . ) and Φxn (n=negative or opposite), which are output from the translator 304. These translated signals Φx and Φxn have opposite characteristics in order to control the source 400 and sink 500 switches according to their required parameters. The difference between Φx and Φxn is that Φx is True (ON) when the voltage is high and False (OFF) when the voltage is low, where Φxn is True when the voltage is low and False when the voltage is high. For example, Φ1 would be used to drive the switches 324 and 506, where Φ1n would be used to drive switches 322 and 406. Also, switch 328 would be driven by Φ2 and switch 326 would be driven by Φ2n.

Signals Φx and Φxn are generated from the digital signal leaving comparator 302. These signals Φx and Φxn are voltage-based sub-versions of the clock signal 106, and variances of these sub-versions. In a first instance, these sub-versions require variances of the clock signal for several power supply voltages. There may be signals where the high voltages of a clock signal are represented by a 3 V signal, while a lower version of the same signal on a lower voltage power supply may represent the high level by a 1.5 V signal. Accordingly, there could be various Φx and Φxn coming out of the voltage translator 304, with different voltage levels representing the high voltage level associated with a corresponding power supply level.

Although the preferred embodiment of the invention just described utilizes alternating pre-charge and current source/sink modes, it is also possible to have one or more precharge modes followed by one or more current source/sink modes to achieve various ratios of source and sink currents and to provide other functionality based upon the precise ratio of a current source and sink.

The invention has been described with reference to preferred embodiments. Those skilled in the art will perceive improvements, changes, and modifications. Such improvements, changes and modifications are intended to be covered by the appended claims.

We claim:

1. An apparatus comprising:
   a clock source configured to generate a first clock signal having an undefined duty cycle;
   a clock signal duty cycle controller coupled to the clock source and configured to process the first clock signal and output a second clock signal having a precisely controlled duty cycle; and
   a clock signal utilizing device operatively coupled to the clock signal duty cycle controller, wherein the clock signal duty cycle controller includes a circuit configured to generate the second clock signal, the circuit comprising:
      a comparator;
      a signal processing device coupled to an output terminal of the comparator and operable to generate control signals;
      first and second current devices coupled to the signal processing device to receive the control signals; and
      a reference charge storage device operatively coupled between the first and second current devices and the comparator.

2. The apparatus of claim 1, wherein the reference charge storage device is a capacitor.

3. The apparatus of claim 1, wherein:
   the first current device is a current source; and
   the second current device is a current sink.

4. The apparatus of claim 3, wherein:
   the first current device is a voltage controlled current source; and
   the second current device is a voltage controlled current sink.

5. The apparatus of claim 3, wherein:
   the current source includes a pFET coupled to a capacitor and switches; and
   the current sink includes an nFET coupled to a capacitor and switches.

6. An apparatus comprising:
   a clock source configured to generate a first clock signal having an undefined duty cycle;
   a clock signal duty cycle controller coupled to the clock source and configured to process the first clock signal and output a second clock signal having a precisely controlled duty cycle; and
   a clock signal utilizing device operatively coupled to the clock signal duty cycle controller;
   wherein the clock signal duty cycle controller includes a circuit configured to generate the second clock signal, the circuit comprising:
      a comparator;
      a signal processing device coupled to the comparator;
      first and second current devices coupled to the signal processing device; and
      a reference charge storage device operatively coupled between the first and second current devices and the comparator; and wherein:
         the reference charge storage device is coupled to a negative terminal of the comparator;
         the clock source is coupled to the positive terminal of the comparator; and
         the clock signal utilizing device is coupled to an output terminal of the comparator.

7. A clock signal duty cycle controller, comprising:
   a comparator configured to receive an input clock signal and a reference signal, and to output a precision controlled duty cycle clock signal;
   a signal processing device coupled to the output of the comparator;
   first and second current devices coupled to the signal processing device; and
   a reference charge storage device for generating a reference signal operatively coupled between the first and second current sources and the comparator.

8. The controller of claim 7, wherein:
   the first current device is a voltage controlled current source; and
   the second current device is a voltage controlled current sink.

9. The controller of claim 7, wherein:
   the first current device is a current source; and
   the second current device is a current sink.

10. The controller of claim 9, wherein:
    the current source includes a pFET coupled to a capacitor and switches; and
    the current sink includes a nFET coupled to a capacitor and switches.

11. The controller of claim 10, wherein:
    the pFET and capacitor are configured to store a charge value proportional to a first current value when a first predetermined number of the switches are opened;
    the nFET and capacitor are configured to store a charge value proportional to a second current value when a first predetermined number of the switches are opened; and
    the first and second current values are identical.

12. The controller of claim 11, wherein:
    the current source is configured to conduct current such that a current with the first current value flows to the reference charge storage device when a second predetermined number of switches are opened;
    the current sink is configured to conduct current such that a current with the second current value flows to the reference charge storage device when a second predetermined number of switches are opened; and
    the device outputs an output clock signal such that the output clock signal has a predetermined duty cycle based on the reference value input into the comparator.

13. An apparatus configured to convert a curvilinear clock signal into a square-wave clock signal and to program current, comprising:
    a voltage controlled current source, the current source including a pFET coupled to first, second, and third source switches and a source capacitor; and
    a voltage controlled current sink, tile current sink including a nFET coupled to the pFET and coupled to first, second and third sink switches and a sink capacitor.

14. A clock signal duty cycle controlling apparatus, comprising:

means for generating a clock signal;

means for receiving the clock signal, the means for receiving being configured to generate an output clock signal with a predetermined duty cycle based on the received clock signal, wherein the means for receiving comprises:
- means for comparing the received clock signal to a reference value in order to generate the output clock signal;
- means for translating the output clock signal to generate a plurality of second signals based on the output clock signal;
- means for producing a reference current, the means for producing a reference current operatively controlled by the plurality of second signals; and
- means for generating the reference value based on the reference current; and means for propagating logic based on the output clock signal.

15. The apparatus of claim 14, wherein:

during a first mode of operation the means for producing a reference current is configured to be programmed; and during a second mode of operation the means for producing a reference current is configured such that, based on the programming, two identical currents are generated that are combined to produce the reference current.

16. A method comprising the steps of:

receiving a clock signal with an undefined duty cycle;

generating an output clock signal with a predetermined duty cycle by: (A) comparing the received clock signal to a reference value in order to generate the output clock signal; (B) translating the output clock signal to generate a plurality of second signals based on the output clock signal; (C) utilising the plurality of second signals to control first and second current devices that generate the reference value.

17. An apparatus comprising:

a clock source configured to generate a first clock signal having an undefined duty cycle;

a clock signal duty cycle controller coupled to the clock source and configured to process the first clock signal and output a second clock signal having a precisely controlled duty cycle; and a clock signal utilizing device operatively coupled to the clock signal duty cycle controller;

wherein the clock signal duty cycle controller includes a circuit configured to generate the second clock signal, the circuit comprising:
- a comparator operable to output at an output terminal the second clock signal having the precisely controlled duty cycle;
- a signal processing device coupled to the output terminal of the comparator and operable to generate control signals;
- a current device coupled to the signal processing device and operable to control a current in response to the control signals generated by the signal processing device; and
- a reference charge storage device operatively coupled to the current device and operable to store a charge in response to the current controlled by the current device.

* * * * *

UNITED STATES PATENT AND TRADEMARK OFFICE
CERTIFICATE OF CORRECTION

PATENT NO. : 6,578,154 B1 Page 1 of 1
DATED : June 10, 2003
INVENTOR(S) : John Wynen, Richard Madter and Andrew Fergusson It is certified that error appears in the above-identified patent and that said Letters Patent is hereby corrected as shown below:

<u>Column 8,</u>
Line 64, please replace "tile" with -- the --

Signed and Sealed this

Twenty-second Day of July, 2003

JAMES E. ROGAN
*Director of the United States Patent and Trademark Office*